US010938309B1

(12) United States Patent
Malechek (10) Patent No.: US 10,938,309 B1
(45) Date of Patent: Mar. 2, 2021

(54) CONTROLLING OPERATION OF A VOLTAGE CONVERTER BASED ON INDUCTOR CURRENT

(71) Applicant: Raytheon Company, Waltham, MA (US)

(72) Inventor: Steven Mark Malechek, Murphy, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/657,309

(22) Filed: Oct. 18, 2019

(51) Int. Cl.
*H02M 3/335* (2006.01)
*H03K 7/08* (2006.01)

(52) U.S. Cl.
CPC ... *H02M 3/33507* (2013.01); *H02M 3/33569* (2013.01); *H03K 7/08* (2013.01)

(58) Field of Classification Search
CPC ............. H02M 3/335; H02M 3/33584; H02M 3/33592
See application file for complete search history.

(56) References Cited

U.S. PATENT DOCUMENTS

| | | | | |
|---|---|---|---|---|
| 6,426,884 | B1* | 7/2002 | Sun | H02M 3/33592 363/127 |
| 8,373,403 | B1* | 2/2013 | Radovic | H02M 3/1588 323/284 |
| 9,190,898 | B2 | 11/2015 | Brinlee et al. | |
| 9,379,621 | B1 | 6/2016 | Kalyanaranman et al. | |
| 9,621,056 | B2* | 4/2017 | Wu | H02M 3/33507 |
| 9,812,971 | B1* | 11/2017 | Tschirhart | H02M 1/40 |
| 9,825,546 | B2* | 11/2017 | Tang | H02M 3/33546 |
| 10,389,231 | B2* | 8/2019 | Bang | H02P 27/06 |

(Continued)

FOREIGN PATENT DOCUMENTS

EP 2892141 A1 7/2015

OTHER PUBLICATIONS

Hrishikesh Nene. "Digital Control of a Bi-Directional DC-DC Converter for Automotive Applications." In: Texas Instruments Inc., C2000 Systems and Applications (Texas, Stafford, 2013), pp. 1360-1365.

(Continued)

*Primary Examiner* — Thienvu V Tran
*Assistant Examiner* — Sisay G Tiku
(74) *Attorney, Agent, or Firm* — Burns & Levinson, LLP; Joseph M. Maraia (57) ABSTRACT

An example voltage converter includes a transformer having a primary winding, a first secondary winding, and a second secondary winding; a first transistor connected between a first terminal of the first secondary winding and electrical ground; a second transistor connected between a second terminal of the second secondary winding and electrical ground; an inductor connected to a center tap of the transformer between the first secondary winding and the second secondary winding; and a capacitor that is connectable along a current path to the transformer that includes the inductor via at least one of the first transistor or the second transistor. A control system generates, based on characteristics of current through the inductor, pulse-width modulated control signals to control operation of the first transistor and the second transistor to produce voltage at the primary winding based on a voltage across the capacitor.

22 Claims, 4 Drawing Sheets

(56) References Cited

U.S. PATENT DOCUMENTS

| | | |
|---|---|---|
| 2003/0067794 A1 | 4/2003 | Boylan et al. |
| 2007/0230228 A1 | 10/2007 | Mao |
| 2012/0294052 A1* | 11/2012 | Reddy .................. H02M 1/36 363/49 |
| 2012/0320633 A1* | 12/2012 | Chen ................ H02M 3/33592 363/21.01 |
| 2013/0003420 A1* | 1/2013 | Ye .................... H02M 3/33515 363/17 |
| 2014/0009970 A1 | 1/2014 | Brinlee et al. |
| 2014/0009978 A1 | 1/2014 | Brinlee et al. |
| 2014/0140106 A1 | 5/2014 | Duan et al. |
| 2014/0192560 A1* | 7/2014 | Ou .................... H02M 3/33507 363/16 |
| 2014/0254206 A1* | 9/2014 | Ou .................... H02M 3/33592 363/21.01 |
| 2014/0313784 A1* | 10/2014 | Strzalkowski .... H02M 3/33584 363/17 |
| 2015/0036390 A1* | 2/2015 | Ou ........................ H02M 3/337 363/17 |
| 2015/0098250 A1* | 4/2015 | Wu .................... H02M 3/33507 363/17 |
| 2015/0098254 A1 | 4/2015 | Brinlee et al. |
| 2015/0236596 A1* | 8/2015 | Fan .................. H02M 3/33523 363/17 |
| 2016/0079866 A1* | 3/2016 | Mizushima ......... H02M 3/3376 363/17 |
| 2016/0352231 A1* | 12/2016 | Quigley .................. H02M 1/36 |
| 2017/0353116 A1* | 12/2017 | Zhang ............... H02M 3/33592 |
| 2019/0199197 A1* | 6/2019 | Hamada ................ H02M 1/083 |
| 2019/0222134 A1 | 7/2019 | Kikuchi |
| 2020/0067416 A1* | 2/2020 | Tang ....................... H02M 1/44 |

OTHER PUBLICATIONS

Vitale, Giovanni, (2013), DC/DC Converter for HEVs and Resonant Active Clamping Technique, AEIT Annual Conference 2013, Mondello, IT, 2013. Catania, IT: IEEE.

Microchip Technology, Inc. (2019) Synchronous Buck Converter Overview—Developer Help. pp. 1-5. Retrieved from: https://microchipdeveloper.com/desanl:synchronous-buck-converter-overview.

Semiconductor Components Industries, LLC. (2013) Publication Order No. AND9135/D LC Selection Guide for the DC-DC Synchronous Buck Converter. pp, 1-7. Retrieved from: http://onsemi.com.

Texas Instruments Inc. (2018), TI Designs evaluation: TIDA-BiDIR-400-12 Bidirectional DC-DC Converter, Matteo-Alessandro Kutschak et al. Dallas, TX: Hrishikesh Nene. pp. 1-78.

Infineon Technologies AG. (2018). Technologies AG system solution evaluation: 3300 W 54 V bi-directional phase-shift full-bridge with 600 V CoolMOS™ CFD7 and XMC™. Matteo-Alessandro Kutschak et al. pp. 2-44. Retrieved from: https://www.infineon.com/cfd7.

International Search Report and Written Opinion from related PCT Application No. PCT/US2020/031582 dated Jul. 2, 2020.

Non-Final Office Action for U.S. Appl. No. 16/657,353, dated Sep. 24, 2020, (27 pages).

* cited by examiner

CONTROLLING OPERATION OF A VOLTAGE CONVERTER BASED ON INDUCTOR CURRENT

TECHNICAL FIELD

This specification describes examples of step-down converters that are controllable to operate as step-up converters.

BACKGROUND

A voltage converter changes the magnitude of a voltage from its input to its output. A step-down converter is a type of voltage converter that reduces the magnitude of a voltage from its input to its output. An example of a step-down converter is a buck converter. A step-up converter is a type of voltage converter that increases the magnitude of a voltage from its input to its output. An example of a step-up converter is a boost converter.

SUMMARY

An example voltage converter includes a transformer having a primary winding, a first secondary winding, and a second secondary winding; a first transistor connected between a first terminal of the first secondary winding and electrical ground; a second transistor connected between a second terminal of the second secondary winding and electrical ground; an inductor connected to a center tap of the transformer between the first secondary winding and the second secondary winding; and a capacitor that is connectable along a current path to the transformer that includes the inductor via at least one of the first transistor or the second transistor. A control system is configured to generate, based on characteristics of current through the inductor, pulse-width modulated control signals to control operation of the first transistor and the second transistor to produce voltage at the primary winding based on a voltage across the capacitor. The voltage converter may include one or more of the following features either alone or in combination.

The voltage converter may include a detector to detect a peak in the current through the inductor. The peak may correspond to a minimum current through the inductor. The minimum current may be one of the characteristics. The voltage converter may include one or more analog comparators to compare the current through the inductor to a threshold in order to detect a peak in the current through the inductor.

The peak may correspond to a maximum current through the inductor. One or more peak or level detectors may be configured to detect to the maximum current through the inductor, the minimum current through the inductor, or both.

The characteristics may include a maximum current through the inductor and a minimum current through the inductor. The control system may be configured to generate a first pulse-width modulated control signal to drive the first transistor to conduction in response to detecting the minimum current through the inductor. The control system may be configured to generate a second pulse-width modulated control signal to cause the second transistor to become non-conductive in response to detecting the maximum current through the inductor. The control system may be configured to generate a third pulse-width modulated control signal to drive the second transistor to conduction in response to detecting the minimum current through the inductor. The control system may be configured to generate a fourth pulse-width modulated control signal to cause the first transistor to become non-conductive in response to detecting the maximum current through the inductor.

Each pulse-width modulated control signal may have a rising edge that corresponds to the minimum current and may have a falling edge that corresponds to the maximum current. The pulse-width modulated control signals may control operation of the first transistor and the second transistor to enable discharge of the capacitor via the inductor. The pulse-width modulated control signals may control operation of the first transistor and the second transistor to enable partial discharge of the capacitor. The pulse-width modulated control signals may control operation of the first transistor and the second transistor to enable complete or partial discharge of the capacitor.

The voltage converter may include input transistors connected electrically to the primary winding. The control system may be configured to apply control signals to gates of the input transistors to cause the input transistor to operate as diodes. The voltage converter may possibly include clamping diodes connected between voltages rails on a primary winding side of the transformer. The clamping diodes may be configured to reduce ringing on a secondary side of the transformer.

The voltage converter may be a buck converter. Controlling operation of the first transistor and the second transistor to produce voltage at the primary winding based on a voltage across the capacitor may constitute controlling the buck converter to operate as a boost converter. The primary winding may be configured to support a higher voltage than a combined voltage of the first secondary winding and the second secondary winding multiplied by a turns ratio of the transformer.

An example method of controlling a voltage converter includes detecting characteristics of a current through an inductor connected to a center tap of a transformer between a first secondary winding and a second secondary winding, where the inductor is connected in series with a capacitor that is connected to electrical ground; generating pulse-width modulated control signals based on characteristics of the current through the inductor; and controlling operation of a first transistor and a second transistor based on the pulse-width modulated control signals to cause the capacitor to discharge current through the inductor towards the transformer and thereby produce a voltage at a primary winding of the transformer. The first transistor is connected between the first secondary winding of the transformer and electrical ground, and the second transistor is connected between the second secondary winding of the transformer and electrical ground. The method may include one or more of the following features either alone or in combination.

The characteristics may include a maximum current through the inductor and a minimum current through the inductor. Detecting the characteristics may include detecting a peak in the current through the inductor. The peak may correspond to a minimum current through the inductor. The minimum current may be one of the characteristics. Detecting the characteristics may include comparing the current through the inductor to a threshold in order to detect a peak in the current through the inductor. The peak may correspond to a maximum current through the inductor.

The characteristics may include a maximum current through the inductor and a minimum current through the inductor. Generating the pulse-width modulated control signals may include generating a first pulse-width modulated control signal to drive the first transistor to conduction in response to detecting the minimum current through the inductor. Generating the pulse-width modulated control signals may include generating a second pulse-width modulated control signal to cause the second transistor to become non-conductive in response to detecting the maximum current through the inductor. Generating the pulse-width modulated control signals may include generating a third pulse-width modulated control signal to drive the second transistor to conduction in response to detecting the minimum current through the inductor. Generating the pulse-width modulated control signals may include generating a fourth pulse-width modulated control signal to cause the first transistor to become non-conductive in response to detecting the maximum current through the inductor.

Each pulse-width modulated control signal may have a rising edge that corresponds to the minimum current and may have a falling edge that corresponds to the maximum current. The pulse-width modulated control signals may control operation of the first transistor and the second transistor to enable complete or partial discharge of the capacitor via the inductor.

Any two or more of the features described in this specification, including in this summary section, may be combined to form implementations not specifically described in this specification.

At least part of the circuitry and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the circuitry and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of a step-down voltage converter that is not designed to operate as a step-up converter, but that is controllable to operate as a step-up voltage converter. In an example, the step-down voltage converter is a buck converter having a phase-shifted full bridge (PSFB) topology. The buck converter is a direct current (DC) to DC voltage converter that uses synchronous rectification to perform the switching required to produce the voltage provided at its output to a load. To implement this switching, the buck converter includes transistor-based switches. These switches are controllable to direct current through an inductor connected in series with an output terminal and one or more capacitors, which are referred to herein as a capacitor bank, connected in parallel with the output terminal. The capacitor bank is arranged as it is, and sized, to reduce voltage transients at the output.

When the buck converter is shut-down, the capacitor bank may be discharged. However, in some cases, the size of the capacitor bank is such that it can take on the order of minutes to discharge to a zero voltage. In addition, in some cases, due to this discharge duration, the voltage in the system can remain at a non-zero value for too long resulting in damage to the converter. To decrease the time it takes to discharge the capacitor bank, the buck converter may be controlled to operate as a boost converter. That is, the buck converter may be operated to generate a voltage output in a reverse direction using the voltage across the capacitor bank. The resulting voltage output is generated using the charge stored in the capacitor bank and, during output, the capacitor bank is continually depleted until the capacitor bank is discharged. This active discharge of the capacitor bank can reduce the time it takes for the capacitor bank to discharge. For example, the time it takes for the voltage across the capacitor bank to reach zero volts can be reduced.

In some implementations, a control system is configured—for example, programmed—to generate pulse-width modulated (PWM) control signals to control operation of the transistor-based switches to operate the buck converter as a boost converter and thereby discharge its capacitor bank. In some implementations, control signals may be generated based solely on a current through the inductor. For example, different characteristics of the current through the inductor may be monitored to generate different parts of the PWM control signals that produce a controlled and rapid discharge of the capacitor bank. For example, as explained below, each PWM control signal may include a rising edge that corresponds to a positive peak in current through the inductor and may include a falling edge that corresponds to maximum negative current through the inductor.

Figure 1:
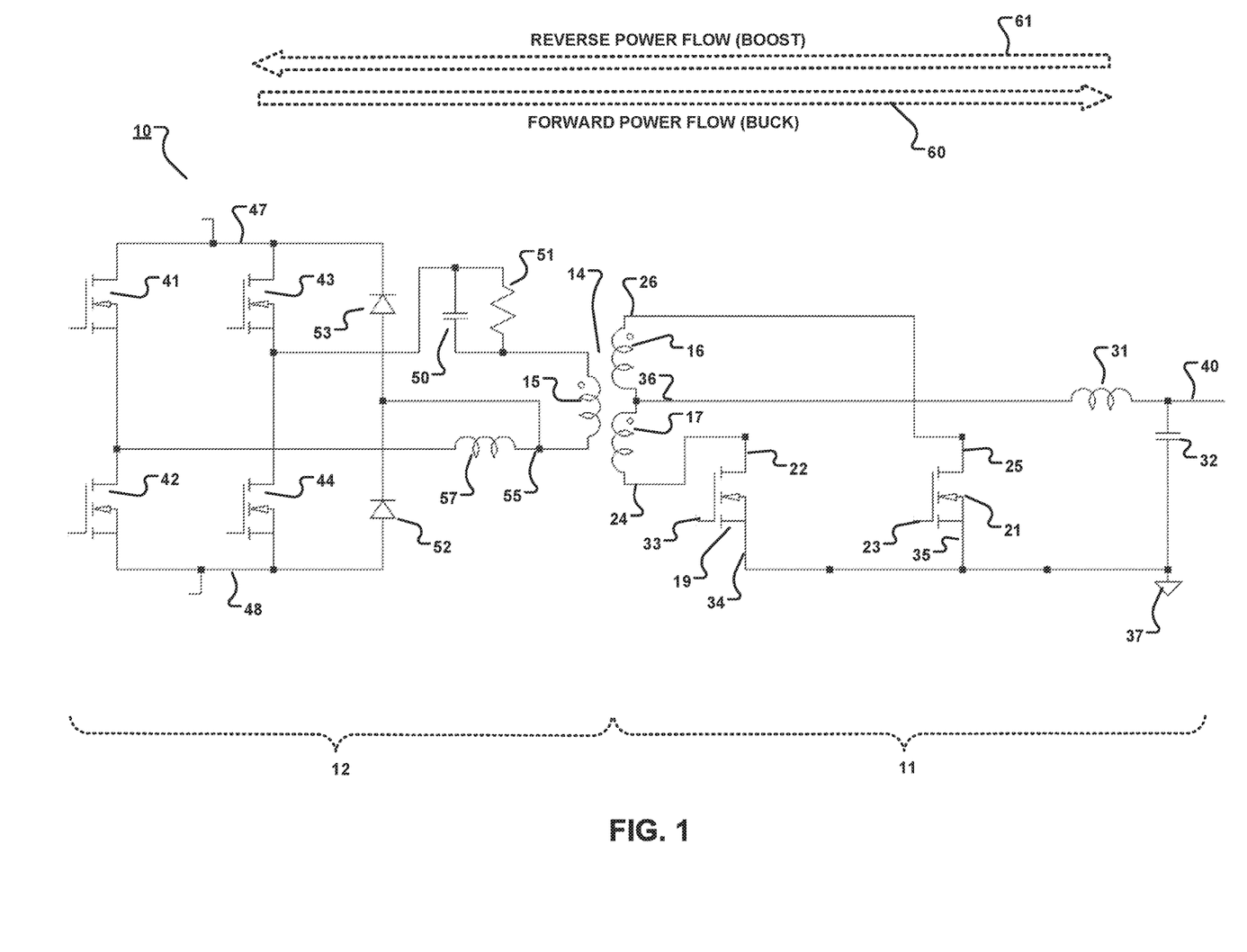
FIG. 1 is a circuit diagram of an example voltage converter.

FIG. 1 shows an example implementation of a buck converter 10 having a PSFB topology that may be controlled to operate as a boost converter. Converter 10 includes a low voltage side 11 and a high voltage side 12. The low voltage side is so named because it receives and/or outputs a low voltage and the high voltage side is so named because it receives and/or outputs a high voltage. "High" and "low" have no specific numerical connotations, but rather are meant only to indicate that the voltage on the high voltage side is greater than the voltage on the low voltage side. In some examples, the high voltage side is referred to as the primary side and the low voltage side is referred to as the secondary side.

A transformer 14 operates as the electrical interface between the low voltage side 11 and the high voltage side 12. In this example, transformer 14 includes a primary winding 15 and two secondary windings 16 and 17. Converter 10 also include transistors 19 and 21. In this example, the transistors are power metal oxide field-effect (MOSFET) transistors, which are controllable to operate as synchronous rectification switches to control the operation of converter 10. As shown, drain 22 of transistor 19 is connected to terminal 24 of secondary winding 17 and drain 25 of transistor 21 is connected to terminal 26 of secondary winding 16.

As shown, inductor 31 is connected to the center tap of transformer 14 between secondary windings 16 and 17. As also shown, inductor 31 is connected in series with capacitor bank 32 and the output terminal 40 of converter 10. A load (not shown)—for example, a device to be driven by the voltage output of the buck converter—may be connected to the output terminal. Depending on how the transistors are switched, a square wave voltage is generated and applied through inductor 31. Capacitor bank 32 is connected in parallel between the load and electrical ground 37. Inductor 31, in combination with capacitor bank 32, filters that square wave voltage to limit ripple in the voltage provided to the load. Sources 34 and 35 of respective transistors 19 and 21 are also connected to electrical ground in this example.

During normal operation—for example, to step-down an input voltage—PWM control signals are applied to the gates of transistors 19 and 21 (and also to transistors 41, 42, 43, and 44 discussed below) to charge the capacitor bank to produce a stepped-down output voltage. In this example, a high voltage input is provided to primary winding 15 and is stepped-down to produce a lower voltage at secondary windings 16 and 17. When a PWM control signal is applied to the gate of transistor 19, transistor 19 conducts. During at least part of the time that transistor 19 is conducting, no control signal (e.g., zero volts) is applied to transistor 21. As a result, transistor 21 does not conduct during this time. While transistor 19 is conducting, current from terminal 36 (the center tap) of secondary winding 17 flows toward output terminal 40 to charge inductor 31 and capacitor bank 32, thereby generating the output voltage across capacitor bank 32. At some time during operation, a PWM signal is applied to the gate of transistor 21, thereby causing transistor 21 to conduct. During at least part of the time that transistor 21 is conducting, no control signal is applied to transistor 19. As a result, transistor 19 does not conduct during this time. During this period of time, the current through inductor 31 discharges to maintain the voltage across the load. This cycle repeats to maintain the stepped-down voltage across the load.

The high voltage side 12 of converter 10 includes transistors 41, 42, 43, and 44. Transistors 41, 42, 43, and 44 form the PSFB, which is configured and controllable to switch a DC input voltage at voltage rails 47 and 48 to produce an alternating DC voltage or square wave DC voltage at primary winding 15 of transformer 14. Capacitor 50 is a blocking capacitor that is used to ensure that transformer 14 does not become unbalanced. For example, when the voltages on either side of transformer 14 are reversed, excessive flux can develop in one direction that may cause the transformer to saturate and not operate normally. Capacitor 50 limits the passage of unbalanced DC current to the transformer and prevents the saturation that can lead to the excessive saturation. Resistor 51 is sized to ensure that capacitor 50 balances and discharges within an acceptable timeframe.

The high voltage side also includes clamp diodes 52, 53. In some implementations, clamp diodes 52, 53 are not included. Clamp diodes 52 and 53 clamp the high-frequency ringing voltage at node 55 between primary winding 15 (a leakage inductance of transformer 14), the capacitance of transistors 19 and 21 on the low voltage side, and the resonant inductor 57 to the input voltage rails 47 and 48. This reduces the current through the transformer windings and resonant inductor 57, which may alleviate or prevent voltage ringing on the low voltage side of the transformer on the drains of transistors 19 and 21. Resonant inductor 57 provides energy storage for the PSFB to operate in a zero voltage switched (ZVS) mode of operation.

As explained previously, converter 10 is controllable to operate in a boost mode—for example, to discharge capacitor bank 32 through transformer 14. As shown in FIG. 1, during forward (buck) operation, power flows in the direction of arrow 60, whereas in boost mode, power flows in the direction of arrow 61. Accordingly, when converter 10 is operated in boost mode, the charge stored in capacitor bank 32 is used to produce a voltage output at the primary winding 15 of transformer 14.

Figure 2:
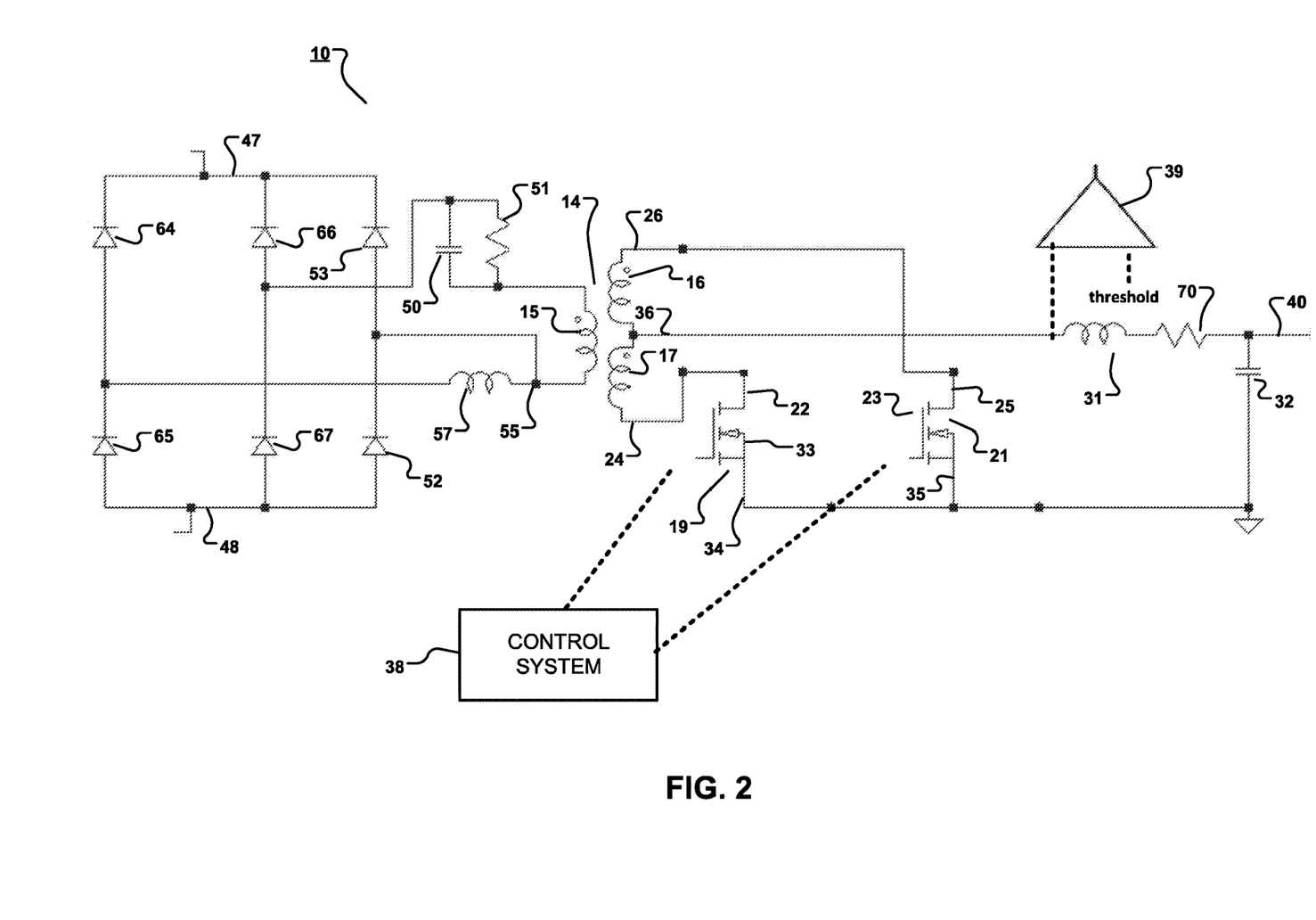
FIG. 2 is a circuit diagram of the example voltage converter configured to operate in a step-up, or boost, mode.

During the boost mode of operation, there may be no control inputs to the gates of transistors 41, 42, 43, and 44 that form the PSFB; for example, zero volts may be applied to the gates of these transistors. In this regard, as noted, in some implementations, transistors 41, 42, 43, and 44 include MOSFETs. When zero volts is applied to their gates, the MOSFETs operate as diodes due to their internal body diodes. Accordingly, during boost mode, converter 10 may be modeled as shown in FIG. 2. That is, transistors 41, 42, 43, and 44 are modeled as respective diodes 64, 65, 66, and 67. The remaining features of FIG. 2 are the same as those of FIG. 1, except that an additional resistor 70 may be added to measure inductor current.

To operate converter 10 in boost mode, transistors 19 and 21 are controlled by applying PWM signals to their respective gates. Transistors 19 and 21 are controlled to connect the capacitor bank along a current path to the transformer that runs through at least one of the transistors to enable the capacitor bank to discharge through the transformer. The PWM signals are generated based, at least in part, on current from the low voltage side 11 to the high voltage side 12. For example, the PWM signals are generated to regulate that current so that the current does not exceed the current limit of the converter and thereby cause damage to the buck converter circuitry. In this regard, an example of a traditional operation of synchronous rectification transistors in a voltage converter includes applying, to the gates of the synchronous rectification transistors, signals that have the same period and that are out-of-phase. When operating converter 10 in boost mode, this would cause transistors 19 and 21 to conduct for equal but different time periods, with no overlap in conduction. This operation of transistors 19 and 21 could cause the current flow from the low voltage side to the high voltage side to become increasingly negative until the current exceeds the current limit of the converter. In boost mode, the systems and processes described herein detect characteristics of the current flowing from the low voltage side 11 to the high voltage side 12 and control transistors 19 and 21 to regulate that current flow.

Figure 3:
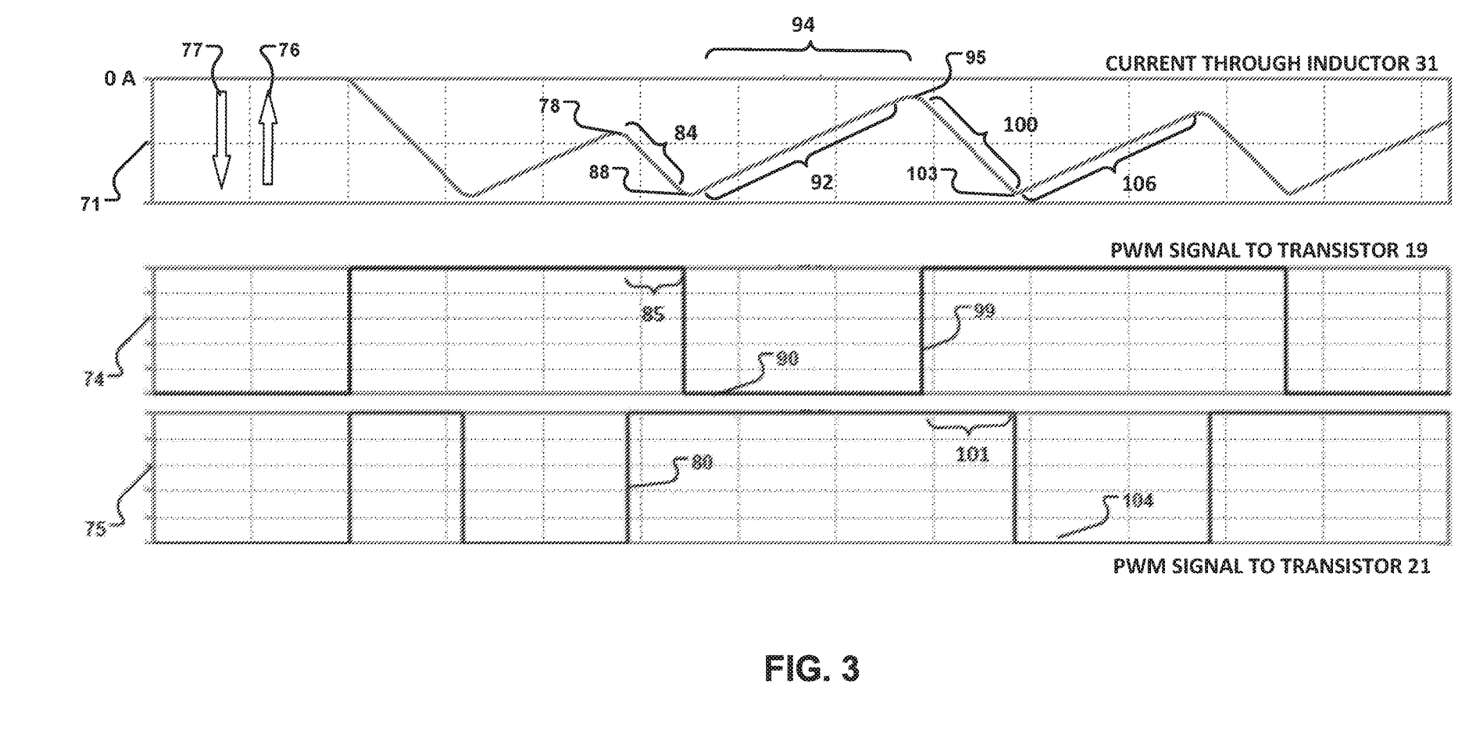
FIG. 3 shows example timing diagrams that illustrate operation of the example voltage converter in step-up, or boost, mode.

FIG. 3 includes timing diagrams 71, 74, and 75 that illustrate an example operation of converter 10 in boost mode. Timing diagram 71 shows the current through inductor 31; timing diagram 74 shows the PWM control signal applied to the gate of transistor 19; and timing diagram 75 shows the PWM control signal applied to the gate of transistor 21. In each timing diagram, the X-axis includes time and the Y-axis includes current or voltage as indicated below.

As noted, timing diagram 71 shows the current through inductor 31. The current is depicted as negative (less than zero amperes ("0 A" in the figure)), since the current is flowing in the direction of arrow 61 in FIG. 1. That is, negative current is designated as current flowing away from the capacitor bank or load and towards transformer 14, whereas positive current is designated as current flowing away from transformer 14 and towards the capacitor bank or load. For the purposes of the following explanation, since the current through inductor 31 is considered negative, current changing in the direction of arrow 76 is referred to as decreasing (that is, less negative current) and current changing the direction of arrow 77 is referred to as increasing (that is, more negative current).

FIG. 3 shows characteristics of the current through inductor 31 including positive peaks, such as positive peak 78, in the inductor current, and negative peaks, such as negative peak 88 in the inductor current. In this regard, a positive peak 78 indicates a change in slope—that is, a decrease followed by an increase—in current through inductor 31. As explained below, a negative peak—that is, an increase followed by a decrease—in current corresponds to a maximum negative current in the inductor.

At approximately the positive peak, the current through the inductor approaches or reaches zero. Accordingly, each positive peak represents a local minimum current through the inductor. The minimum is characterized as local because it may fluctuate from cycle-to-cycle. Also at approximately the positive peak, the current begins to circulate internally within the high voltage side or on the primary winding of the transformer and is not transferred out to the input at nodes 47 and 48. That current, if unchecked, can cause damage to the converter. Accordingly, when a positive peak—in this example, positive peak 78—is detected in the inductor current, transistor 21 is driven to conduction by applying a non-zero voltage 80 to its gate 23. This produces a controlled increase 84 in current through inductor 31.

As shown in timing diagram 74, transistor 19 remains conductive temporarily 85 while transistor 21 is driven to conduction. In this regard, use of a center-tapped secondary winding may require that transistors 19 and 21 always have some temporary conduction overlap in order to keep secondary voltage spikes down. For example, as shown in timing diagrams 74 and 75, there is always a temporary overlap, such as overlap 85, in operation between transistors 19 and 21. In the configuration of FIGS. 1 and 2, if both of transistors 19 and 21 are non-conductive at the same time, all of the energy from the transformer may instantly transfer to those transistors as a high voltage spike. This could damage the transistors. The temporary overlap in conduction between transistors 19 and 21 may reduce the chances that this type of damage will occur.

At some time following conduction of transistor 21, a maximum negative current through the transformer is detected. This maximum negative current is represented by negative peak 88 in timing diagram 71. The maximum negative current may have a predefined magnitude that is based on operational characteristics of the transformer and other circuitry used to implement the buck converter. Exceeding the maximum negative current could result in damage to the circuitry. Accordingly, at that time, transistor 19, which is already conducting as shown in timing diagram 74, is made non-conductive by applying a zero voltage 90 to its gate 33. This produces a controlled decrease 92 in current through the inductor, as shown in timing diagram 71. In this regard, by using characteristics of current through inductor 31 to start and end a switching cycle 94, the system may be able automatically to adjust for variations in input and output voltage, temperature, and component value variations.

The controlled decrease 92 in current continues until another positive peak 95 is detected. In response, transistor 19—the previously non-conductive transistor—is driven to conduction by applying a non-zero voltage 99 to its gate 33. This produces a controlled increase 100 in current through inductor 31. As shown in timing diagram 75, transistor 21 remains temporarily conductive 101 while transistor 19 is driven to conduction. At some time following conduction of transistor 19, a maximum negative current through the inductor is detected. This maximum negative current is represented by negative peak 103 in timing diagram 71. Accordingly, at that time, transistor 21, which is already conducting as shown in timing diagram 75, is made non-conductive by applying a zero voltage 104 to its gate 23. This produces a controlled decrease 106 in current through the inductor, as shown in timing diagram 71.

The foregoing process repeats to provide controlled current flow from the low voltage side of the buck converter to the high voltage side of the buck converter. In the examples described herein, the foregoing process repeats until the capacitor bank is discharged to zero volts or substantially zero volts.

The example circuitry of FIGS. 1 and 2 also includes components (not shown) to detect the positive peaks and the negative peaks in the inductor current. For example, the circuitry may include multiple analog comparators. One or more of the comparators may be used to detect the negative peak of the inductor current. For example, an analog comparator 39 (FIG. 2) may compare the inductor current to a predefined threshold. When that threshold is reached, the maximum negative current is detected. Resistor 70 may also be included to detect the current through inductor 31.

The positive peak in the inductor current may be detected using a peak or level detector circuit. In this example, the peak or level detector includes circuitry that is configured to measure the amplitude of the positive peak—that is, the minimum magnitude—of the current through inductor 31. Any appropriate peak or level detector circuitry may be used. The speed of the peak or level detector will be based on the circuitry used in converter 10. For example, the peak or level detector may be in the range of 10 megahertz (MHz) or greater. The peak or level detector may also be configured and arranged to detect the maximum current through the inductor.

The times at which the positive peak and the negative peak (maximum negative current) are detected may be digitized and transmitted to the control system. The control system uses the resulting data to control the gates of transistors 19 and 21 in the manner described with respect to timing diagrams 74 and 75.

Figure 4:
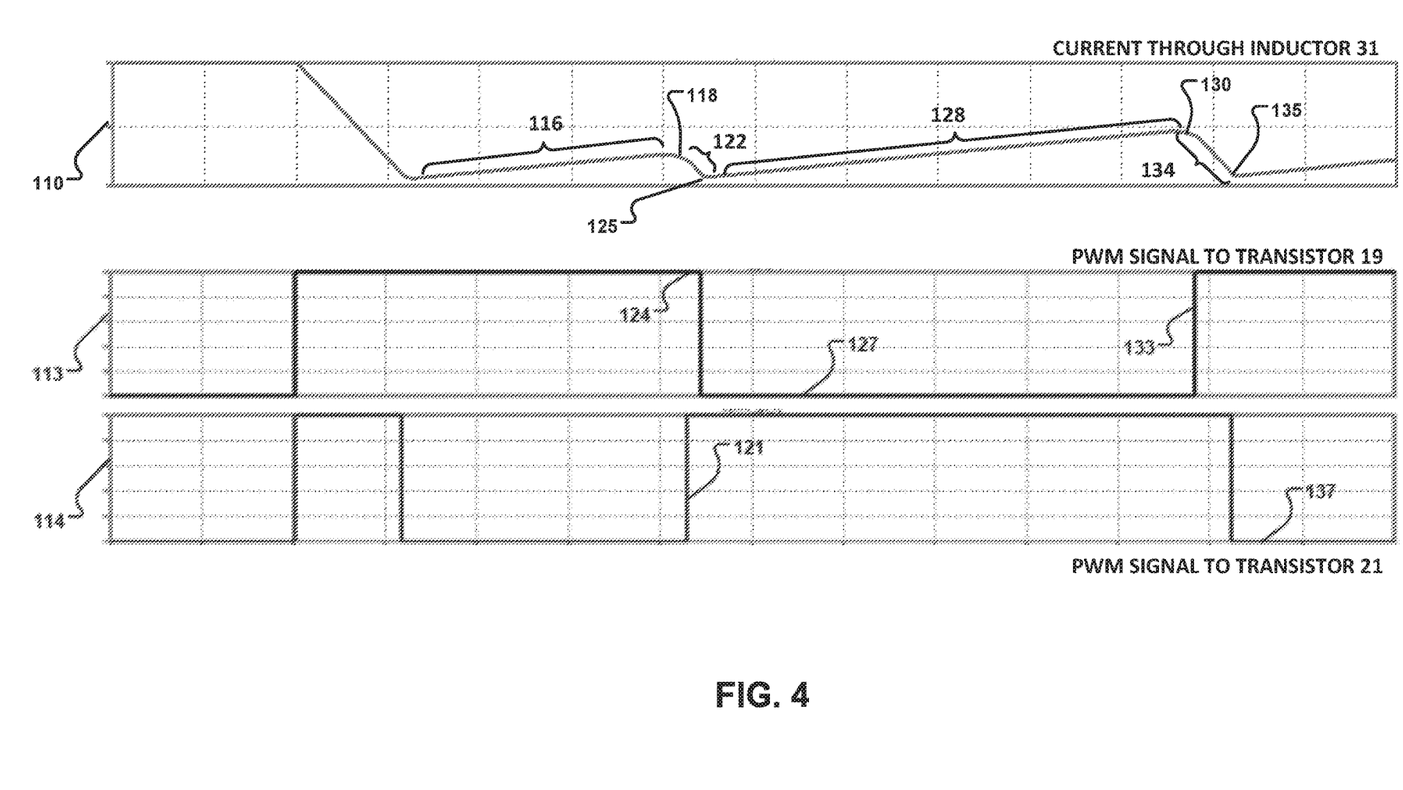
FIG. 4 shows another example of timing diagrams that illustrate operation of the example voltage converter in step-up, or boost, mode.

FIG. 4 includes timing diagrams 110, 113, and 114 that illustrate another example operation of converter 10 in boost mode. Comparing FIG. 4 to FIG. 3, it is evident that the decreasing inductor current—for example, decreases 92 and 116—occurs at a lower rate in FIG. 4 than in FIG. 3. This is due to characteristics of the transformer and converter operating point such as input and output voltage at an instant in time. In the example of FIG. 3, the turns ratio of the transformer can support an input voltage that is considerably greater than the voltage that can be generated by the low voltage side of the converter. In the example of FIG. 4, the turns ratio of the transformer can support an input voltage that is greater than the voltage that can be generated by the low voltage side of the converter, but not as great as the voltage that can be supported by the transformer turns ratio in the example of FIG. 3. In this regard, if the primary winding cannot support the voltage generated by on the low voltage side, then the converter may not be operable as a boost converter or may be operable as a boost converter over a limited input and output voltage range only. Accordingly, to operate in boost mode, the transformer turns ratio is configured to support a higher voltage than a combined voltage of the first secondary winding and the second secondary winding taking into account a turns ratio of the transformer. For example, a transformer having appropriate numbers of windings and ratios may be selected. For example, the primary winding may be configured to support a higher voltage than a combined voltage of the first secondary winding and the second secondary winding multiplied by a turns ratio of the transformer.

Notwithstanding the foregoing differences, as explained below, the basic operation depicted in FIG. 4 is the same as the basic operation depicted in FIG. 3. Timing diagram 110 shows the current through inductor 31; timing diagram 113 shows the PWM control signal applied to the gate of transistor 19; and timing diagram 114 shows the PWM control signal applied to the gate of transistor 21. As above, the current is depicted as negative, since it is flowing in the direction of arrow 61 in FIG. 1.

As was the case above, at approximately a positive peak in the inductor current such as positive peak 118, current stops flowing out of the input and begins to recirculate in the primary side which, if unchecked, can cause damage to the converter. Accordingly, in response to detecting the positive peak 118 in the inductor current, transistor 21 is driven to conduction by applying a non-zero voltage 121 to its gate 23. This produces a controlled increase 122 in current through inductor 31. As shown in timing diagram 113, transistor 19 remains conductive for a time 124 while transistor 21 is driven to conduction.

At some time following conduction of transistor 21, a maximum negative current through the transformer is detected. This maximum negative current is represented by negative peak 125 in timing diagram 110. Accordingly, at that time, transistor 19, which is already conducting as shown in timing diagram 113, is made non-conductive by applying a zero voltage 127 to its gate 33. This produces a controlled decrease 128 in current through the inductor, as shown in timing diagram 110.

The controlled decrease 128 continues until positive peak 130 is detected. In response, transistor 19—the previously non-conductive transistor—is driven to conduction by applying a non-zero voltage 133 to its gate 33. This produces a controlled increase 134 in current through inductor 31. As shown in timing diagram 114, transistor 21 remains conductive while transistor 19 is driven to conduction. At some time following conduction of transistor 19, a maximum negative current through the transformer is detected. This maximum negative current is represented by negative peak 135 in timing diagram 110. Accordingly, at that time, transistor 21, which is already conducting as shown in timing diagram 113, is made non-conductive by applying a zero voltage 137 to its gate 23. This produces a controlled decrease in current through the inductor, as shown in timing diagram 110.

The foregoing process repeats to provide controlled current from the low voltage side of the converter to the high voltage side of the converter. In the examples described herein, the foregoing process repeats until the capacitor bank is discharged to zero volts or substantially zero volts.

The example systems and processes presented herein are described in the context of detecting maximum peaks and minimum peaks in the inductor current. However, the systems and processes may be implemented by detecting any appropriate levels in the inductor current. For example, PWM signals may be generated based on levels in inductor current that are a certain percentage from the maximum inductor current and a certain percentage from the minimum inductor current.

The example systems and processes described herein may be used in any appropriate electronic system. For example, the systems and processes may be used in DC/DC converters within radar systems, antenna systems, or radar and antenna systems. For example, the systems and processes may be used in power supply systems in any appropriate technological context.

All or part of the systems and processes described in this specification and their various modifications may be configured or controlled at least in part by a control system 38 (FIG. 2) that includes one or more computers executing one or more computer programs tangibly embodied in one or more information carriers, such as in one or more non-transitory machine-readable storage media. For example, the PWM signals may be generated by one or more computers using one or more computer programs based on times at which the positive peak and the maximum negative current are detected in the current through inductor 31. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the systems and processes can be performed by one or more programmable processors executing one or more computer programs to control all or some of the well formation operations described previously. All or part of the systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A voltage converter comprising:
   a transformer comprising a primary winding, a first secondary winding, and a second secondary winding;
   a first transistor connected between a first terminal of the first secondary winding and electrical ground;
   a second transistor connected between a second terminal of the second secondary winding and the electrical ground;
   an inductor connected to a center tap of the transformer between the first secondary winding and the second secondary winding;
   a capacitor that is connectable along a current path to the transformer that includes the inductor via at least one of the first transistor or the second transistor; and
   a control system to generate, based on characteristics of current through the inductor, pulse-width modulated control signals to control operation of the first transistor and the second transistor to produce voltage at the primary winding based on a voltage across the capacitor;
   wherein the voltage converter comprises a buck converter; and
   wherein controlling operation of the first transistor and the second transistor to produce the voltage at the primary winding based on a voltage across the capacitor comprises controlling the buck converter to operate as a boost converter.

2. The voltage converter of claim 1, wherein the characteristics comprises a maximum current through the inductor and a minimum current through the inductor.

3. The voltage converter of claim 1, further comprising:
   one or more analog comparators to compare the current through the inductor to a threshold in order to detect a peak in the current through the inductor, the peak corresponding to a maximum current through the inductor.

4. The voltage converter of claim 1, wherein the characteristics comprises a maximum current through the inductor and a minimum current through the inductor;
   wherein the control system is configured to generate a first pulse-width modulated control signal to drive the first transistor to conduction in response to detecting the minimum current through the inductor; and
   wherein the control system is configured to generate a second pulse-width modulated control signal to cause the second transistor to become non-conductive in response to detecting the maximum current through the inductor.

5. The voltage converter of claim 4, wherein the control system is configured to generate a third pulse-width modulated control signal to drive the second transistor to conduction in response to detecting the minimum current through the inductor; and
   wherein the control system is configured to generate a fourth pulse-width modulated control signal to cause the first transistor to become non-conductive in response to detecting the maximum current through the inductor.

6. The voltage converter of claim 1, wherein the characteristics comprises a maximum current through the inductor and a minimum current through the inductor; and
   wherein each pulse-width modulated control signal has a rising edge that corresponds to the minimum current and has a falling edge that corresponds to the maximum current.

7. The voltage converter of claim 1, wherein the pulse-width modulated control signals control operation of the first transistor and the second transistor to enable discharge of the capacitor via the inductor.

8. The voltage converter of claim 1, wherein the pulse-width modulated control signals control operation of the first transistor and the second transistor to enable discharge of the capacitor.

9. The voltage converter of claim 1, further comprising:
   input transistors connected electrically to the primary winding;
   wherein the control system is configured to apply control signals to gates of the input transistors to cause the input transistor to operate as diodes.

10. The voltage converter of claim 1, further comprising:
    clamping diodes connected between voltages rails on a primary winding side of the transformer, the clamping diodes being configured to reduce ringing on a secondary side of the transformer.

11. The voltage converter of claim 1, wherein the primary winding is configured to support a higher voltage than a combined voltage of the first secondary winding and the second secondary winding multiplied by a turns ratio of the transformer.

12. The voltage converter of claim 1, further comprising:
    a detector to detect to a maximum current through the inductor.

13. The voltage converter of claim 1, further comprising:
    a detector to detect a peak in the current through the inductor, the peak corresponding to a minimum current through the inductor, the minimum current comprising one of the characteristics.

14. A method of controlling a voltage converter comprising:
    detecting characteristics of a current through an inductor connected to a center tap of a transformer between a first secondary winding and a second secondary winding, the inductor being connected in series with a capacitor that is connected to electrical ground;
    generating pulse-width modulated control signals based on characteristics of the current through the inductor; and
    controlling operation of a first transistor and a second transistor based on the pulse-width modulated control signals to cause the capacitor to discharge current through the inductor towards the transformer and thereby produce a voltage at a primary winding of the transformer;
    wherein the first transistor is connected between the first secondary winding of the transformer and the electrical ground, and the second transistor is connected between the second secondary winding of the transformer and the electrical ground;
    wherein the voltage converter comprises a buck converter; and
    wherein controlling operation of the first transistor and the second transistor to produce the voltage at the primary winding comprises controlling the buck converter to operate as a boost converter.

15. The method of claim 14, wherein the characteristics comprises a maximum current through the inductor and a minimum current through the inductor.

16. The method of claim 14, wherein detecting the characteristics comprises:

detecting a peak in the current through the inductor, the peak corresponding to a minimum current through the inductor, the minimum current comprising one of the characteristics.

17. The method of claim 14, wherein detecting the characteristics comprises:
comparing the current through the inductor to a threshold in order to detect a peak in the current through the inductor, the peak corresponding to a maximum current through the inductor.

18. The method of claim 14, wherein the characteristics comprises a maximum current through the inductor and a minimum current through the inductor;
wherein generating the pulse-width modulated control signals comprises generating a first pulse-width modulated control signal to drive the first transistor to conduction in response to detecting the minimum current through the inductor; and
wherein generating the pulse-width modulated control signals comprises generating a second pulse-width modulated control signal to cause the second transistor to become non-conductive in response to detecting the maximum current through the inductor.

19. The method of claim 18, wherein generating the pulse-width modulated control signals comprises generating a third pulse-width modulated control signal to drive the second transistor to conduction in response to detecting the minimum current through the inductor; and
wherein generating the pulse-width modulated control signals comprises generating a fourth pulse-width modulated control signal to cause the first transistor to become non-conductive in response to detecting the maximum current through the inductor.

20. The method of claim 14, wherein the characteristics comprises a maximum current through the inductor and a minimum current through the inductor; and
wherein each pulse-width modulated control signal has a rising edge that corresponds to the minimum current and has a falling edge that corresponds to the maximum current.

21. The method of claim 14, wherein the pulse-width modulated control signals control operation of the first transistor and the second transistor to enable discharge of the capacitor via the inductor.

22. A voltage converter comprising:
a transformer comprising a primary winding, a first secondary winding, and a second secondary winding;
a first transistor connected between a first terminal of the first secondary winding and electrical ground;
a second transistor connected between a second terminal of the second secondary winding and the electrical ground;
an inductor connected to a center tap of the transformer between the first secondary winding and the second secondary winding;
a capacitor that is connectable along a current path to the transformer that includes the inductor via at least one of the first transistor or the second transistor;
a control system to generate, based on characteristics of current through the inductor, pulse-width modulated control signals to control operation of the first transistor and the second transistor to produce voltage at the primary winding based on a voltage across the capacitor; and
a detector to detect a peak in the current through the inductor, the peak corresponding to a minimum current through the inductor, the minimum current comprising one of the characteristics.

* * * * *